United States Patent [19]

Pasch

[11] Patent Number: 5,572,064
[45] Date of Patent: Nov. 5, 1996

[54] INPUT-OUTPUT DRIVE REDUCTION IN A SEMICONDUCTOR INTEGRATED CIRCUIT

[75] Inventor: Nicholas F. Pasch, Pacifica, Calif.

[73] Assignee: LSI Logic Corporation, Milpitas, Calif.

[21] Appl. No.: 538,396

[22] Filed: Oct. 3, 1995

Related U.S. Application Data

[63] Continuation of Ser. No. 143,197, Oct. 25, 1993, Pat. No. 5,517,055.

[51] Int. Cl.$^6$ .................................................. H01L 23/552
[52] U.S. Cl. ........................................ 257/659; 257/786
[58] Field of Search .................................. 257/659, 532, 257/786

[56] References Cited

U.S. PATENT DOCUMENTS 5,517,055  5/1996  Pasch ........................................ 257/659

*Primary Examiner*—Mark V. Prenty
*Attorney, Agent, or Firm*—Katz & Cotton, LLP

[57] ABSTRACT

The present invention relates to a method of and system for reducing the drive requirements for the input and output pads of an integrated circuit die. An intermediate structure is added between the output connection pad and substrate to reduce the amount of electron charge required to charge the output pad capacitance to a substantially negligible amount. In addition, an intermediate structure my be added between an input connection pad and substrate to reduce the amount of electron charge required to charge the input pad capacitance to a substantially negligible amount. The present invention connects a transistor amplifier driver to the intermediate structure between the output pad and substrate to charge the capacitance that exists between the intermediate structure and substrate so that the voltage potential of the intermediate structure is substantially the same value as the output pad voltage value. In similar fashion, a transistor amplifier driver is connected to the intermediate structure between the input pad and substrate to charge the capacitance that exists between the intermediate structure and substrate so that the voltage potential of the intermediate structure is substantially the same value as the input pad voltage value.

1 Claim, 5 Drawing Sheets

INPUT-OUTPUT DRIVE REDUCTION IN A SEMICONDUCTOR INTEGRATED CIRCUIT

This is a continuation of U.S. patent application Ser. No. 08/143,197, filed Oct. 25, 1993, and now U.S. Pat. No. 5,517,055, by Nicholas F. Pasch.

BACKGROUND OF THE INVENTION

1. Field of the Invention

The present invention relates generally to semiconductor devices and integrated circuits and, more particularly, to a method of and system for reducing the drive requirements for the input and output pads of an integrated circuit die.

2. Description of the Related Technology

Integrated circuits have revolutionized the field of electronics by making possible a level of technological sophistication unknown in the days of vacuum tubes and even discrete transistors. An integrated circuit may comprise, on a small silicon chip, many thousand or even a million or more transistors, including associated diodes, resistors and capacitors, interconnected together to form complex electronic functions. The integrated circuit chip or "die" is packaged in an encapsulating package having leads or "pins" for connecting the integrated circuit functions to the overall electronic system or product incorporating a plurality of integrated circuits.

Semiconductor integrated circuits comprise the majority of electronic circuits in computers and other digital electronic products. Present technology integrated circuits may contain millions of transistors and be configured, for example, as a central processing unit (CPU), arithmetic logic unit (ALU), random access memory (RAM), programmable logic array (PLA), application specific integrated circuit (ASIC), or digital signal processor (DSP). Both sophistication and speed of operation of these integrated circuits has rapidly increased because of improvements in integrated circuit manufacturing technologies resulting in smaller and faster devices.

Semiconductor integrated circuits may be formed on silicon wafer chip dies by a plurality of layers of different materials. These materials are selected for their conduction, insulation or electron charge characteristics. Transistors may be formed into the silicon die by diffusion means well known to those skilled in the art of fabricating integrated circuit dies.

Layers of insulating oxides may be deposited over selected areas of the integrated circuit die so that conductive layers of polysilicon or metal may be deposited thereon. Various methods of deposition may be utilized such as, for example, chemical vapor deposition (CVD) or other methods well known to those skilled in the art of fabricating integrated circuits. Polysilicon may be used as both a circuit element and a conductor such as, for example, the gate structure in a metal oxide semiconductor field effect transistor (MOSFET). Metal is used for interconnection between various circuit elements and for connection to the integrated circuit connection pads.

Connections from the integrated circuit die are generally made by means of the connection pads. The connection pads are located on the face of the integrated circuit die. Bond wires connect the pads to a lead frame which becomes the pins of the integrated circuit package that connect to the electronic system.

These connection pads on the face of the integrated circuit die may be about 60 to 100 micrometers on a side and may be substantially square. The connection pad is mostly parallel with the face of the die and the pad may have a thickness of about from 0.7 to 1 micrometer. Generally, there are one or more insulating layers between the metal connection pad and the surface of the silicon wafer die or "substrate" face. There may also be one or more additional layers of metal and/or polysilicon between the substrate and the connection pad.

The connection pad surface and substrate form a capacitor wherein the pad is the positively charged plate at a logic high level, typically $V_{dd}$, the substrate is the negatively charged plate at $V_{ss}$, and intervening insulation therebetween is the dielectric. Typically, capacitance associated with a connection pad is about 0.5 to 1 picofarad (pF). The pad capacitance is added to the capacitance of the integrated circuit package and electronic system circuit board. The package and system circuit capacitance may be about 5 pF per connection. Thus, the connection pad adds a significant amount of capacitance to the overall system capacitance per connection.

Any circuit capacitance must be charged when going from a low to high logic state, and discharged when going from a high to low logic state. Charging of the circuit capacitance is performed by an output driver circuit such as, for example, a complementary metal oxide semiconductor (CMOS) transistor amplifier. A CMOS output driver, however, must be designed with electrostatic discharge (ESD) protection in mind. The design rules for CMOS ESD protection restrict the CMOS driver performance, including the current drive capability needed to charge and discharge output circuit capacitance.

Inputs to the integrated circuit die also utilize connection pads similar to the output pads described above. When an input is connected to an output, the input capacitance adds to the overall circuit connection capacitance. Input capacitance may be about 0.5 to 1 pF. This amount of input capacitance is significant and represents the majority of the connected capacitance, especially when multiple integrated circuit dice are connected in a hybrid package utilizing close coupled wire bonding therebetween.

Since CMOS transistor amplifier capacitive drive capabilities are limited because of ESD design constraints, what is needed is a way of reducing the output capacitance charge requirements, and, preferably, the input capacitance charge requirements caused by the connection pad capacitance of the integrated circuit die. By reducing overall connection capacitance charging requirements, smaller driver transistors may be utilized in the output amplifiers of the integrated circuit. Use of small transistors results in a smaller integrated circuit die or the capability of having more transistor functions on a given die size.

SUMMARY OF THE INVENTION

It is, therefore, an object of the present invention to provide an integrated circuit structure, and method of making same, comprising an intermediate structure added between the output connection pad and substrate to reduce the amount of electron charge required to charge the output pad capacitance to a substantially negligible amount.

Another object is to provide an intermediate structure added between an input connection pad and substrate to reduce the amount of electron charge required to charge the input pad capacitance to a substantially negligible amount.

A further object of the present invention is to connect a transistor amplifier driver to the intermediate structure between the output pad and substrate to charge the capacitance that exists between the intermediate structure and substrate so that the voltage potential of the intermediate structure is substantially the same value as the output pad voltage value.

Still a further object is to connect a transistor amplifier driver to the intermediate structure between the input pad and substrate to charge the capacitance that exists between the intermediate structure and substrate so that the voltage potential of the intermediate structure is substantially the same value as the input pad voltage value.

Yet another object is to closely couple a plurality of integrated circuit dice together so as to substantially reduce external capacitive loading therebetween.

Still a further object of the present invention is to reduce the size of driver transistors so as to increase the transistor density on an integrated circuit die.

The above and other objects of the present invention are satisfied, at least in part, by providing an integrated circuit having a plurality of input and output connection pads and a plurality of intermediate structure plates between the respective plurality of input and output connection pads and the integrated circuit die substrate. The capacitance of each of the intermediate structure plates may be charged by internal driver stages that are specifically tailored for that purpose.

The amount of electron charge required to charge a capacitor of value C is given by the following formula:

$$Q=CV \quad (1),$$

where Q is the electron charge in coulombs required, C is the capacitance in farads, and V is the voltage potential in volts. Formula (1) illustrates that the larger the value of V, the larger the value of Q needed to charge the capacitor C to the voltage value V. Thus, if V is small, so will the electron charging requirements for the value Q.

The energy stored in a capacitor is also a function of potential and capacitance. The energy required to charge a capacitor of value C, or the energy stored in the capacitor is given by the formula:

$$W=V^2C/2 \quad (2),$$

where W is the energy in joules (watt-seconds), and V and C are as described above for formula (1).

Capacitance, C, of either the intermediate plate and substrate or the integrated circuit connection pad and intermediate plate, may be determined by the formula:

$$C=0.224 \ KA/d \quad (3),$$

where C is capacitance in picofarads, K is the dielectric constant of the material between the plates, A is the area of one side of one plate in square inches, and d is the separation of the plate surfaces in inches.

By charging the capacitance of the intermediate structure when going from a low to a high logic level, the voltage potential difference between the output connection pad and intermediate structure is substantially negligible. The charge or quantity of electricity that can be held in the electric field between the capacitor plates is proportional to the voltage therebetween. The energy required to charge the capacitor is proportional to the square of the voltage between the capacitor plates. Thus, if the voltage difference between the intermediate structure and the integrated circuit connection pad is minimal, so will be the amount of charge or energy needed to overcome the pad capacitance.

The intermediate structure, in effect, acts as a voltage "shadow" that tracks the voltage level change of the connection pad. The present invention transfers the burden of charging the intermediate structure plate capacitance to a stage prior to, or separate from, the output connection pad driver, and which is not constrained or compromised by the requirements for ESD protection. This is so because the intermediate structure output driver is not required to connect to any external circuitry, thus, ESD protection is not a factor.

The present invention may use, for example, a plate as the intermediate structure and this plate may have similar dimensions as the output connection pad. The plate may be connected to a driver stage such as, for example, a non-inverting CMOS transistor amplifier driver that is optimized to drive the capacitance formed by the plate and integrated circuit substrate. The plate driver only sees the plate capacitance and not the external circuit capacitance that the connection pad driver must deal with, along with being constrained by ESD protection requirements.

In addition to the plate driver being optimized for the plate capacitive load, the plate driver may preferably begin charging the intermediate plate capacitance slightly before the output driver charges the output pad capacitance. This precharging of the plate capacitance allows the intermediate plate driver stage to be of modest output power because the plate does not have to reach the logic level voltage at exactly the same time as does the output pad.

Clearly, the present invention reduces the electron charge requirements for the output pad capacitance, and lessens the power requirements of the output driver because less electron charge is required for charging the capacitance connected to the output pad. Preferably, the present invention may also reduce input electron charge requirements by utilizing an intermediate structure or plate similar to the output plate described above. An integrated circuit connection pad is also used for input signals and suffers from the same capacitive effects with the integrated circuit substrate.

The present invention accomplishes the reduction of the input pad capacitance charging requirements by utilizing an input intermediate structure or plate between the input pad and substrate. The input plate may be metal or polysilicon. A non-inverting driver is utilized to charge the input plate. The output of the driver is connected to the input plate and the input of the driver is connected to the input connection pad. There is a propagation delay of one transistor amplifier gate delay time before the input plate may begin charging. However, if the gate propagation delay is small in comparison to the signal input rise time, than the electron energy required to charge the input connection pad is similarly small. Thus, this post input signal charging of the input plate capacitance effectively reduces the input connection pad capacitance charge requirement to a substantially low value.

Utilizing the above described input and output connection pad capacitance charging reduction structures in conjunction with close connected integrated circuit dice, as would be used in a hybrid integrated circuit, enables the integrated circuit transistors to be designed with a smaller structure. The smaller structure results from not requiring excess capacitive charge drive capability in the output transistors. Smaller drive transistors result in more transistor circuits per integrated circuit die.

A feature of the present invention is utilization of an intermediate structure between an integrated circuit connection pad and the integrated circuit substrate.

Another feature is utilizing a separate charging amplifier connected to the intermediate structure for charging the capacitance thereof.

A further feature is precharging the intermediate structure capacitance slightly before the start of charging the output connection pad capacitance.

Yet a further feature is post charging the intermediate structure capacitance slightly after the start of charging the input connection pad capacitance.

An advantage of the present invention is a reduction in the size of transistors used as amplifier drivers for charging connection pad capacitance.

A further advantage is improved speed of operation with the same size and charging capacity transistor amplifier drivers.

Other and further objects, features and advantages will be apparent from the following description of a presently preferred embodiment of the invention, given for the purpose of disclosure and taken in conjunction with the accompanying drawings.

DESCRIPTION OF THE PREFERRED EMBODIMENT

Figure 1:
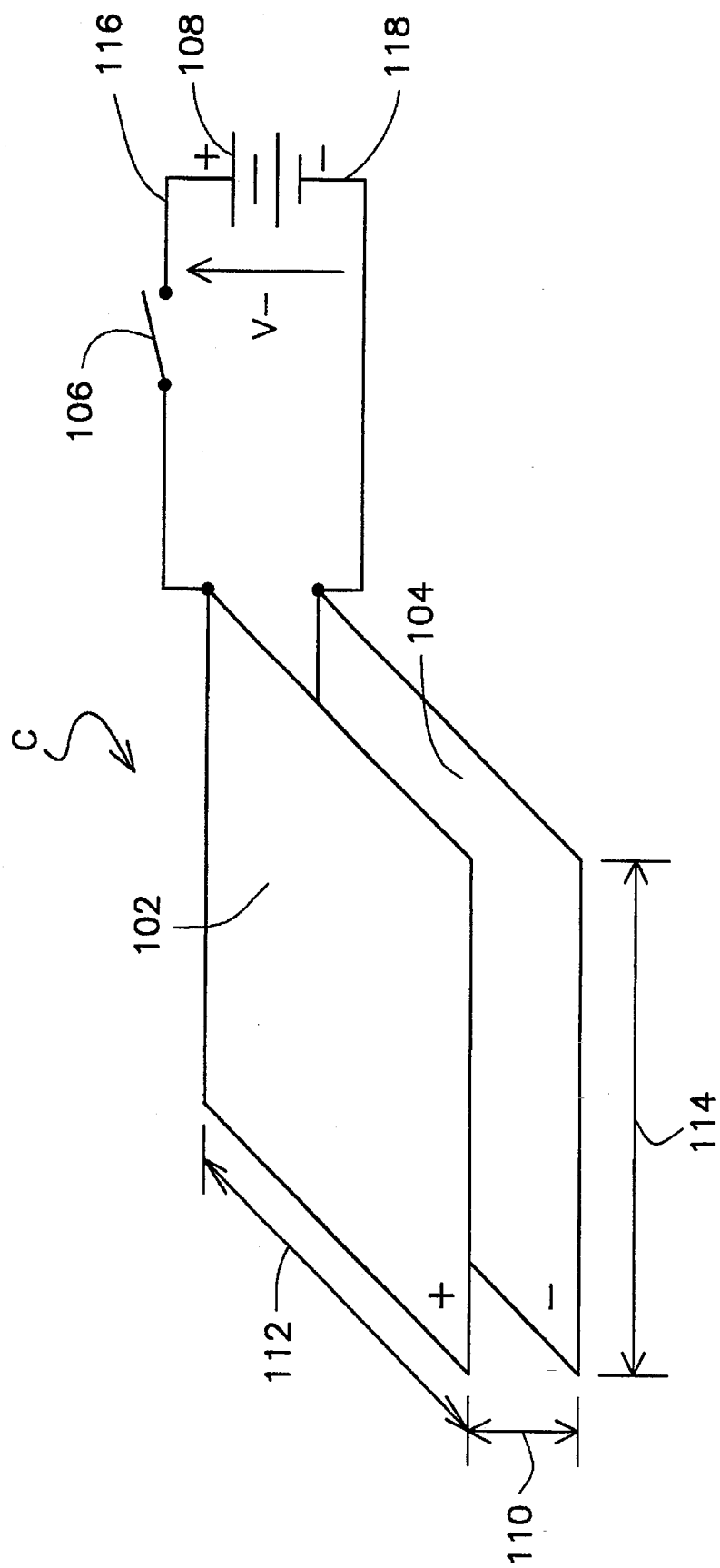
FIG. 1 is a schematic isometric view of a capacitor structure and electrical connections to a voltage source.

The present invention is a system and method for reducing the capacitive charging requirements for both input and output connection pads on an integrated circuit die. Like elements in the drawings will be represented by like numbers, and similar elements will be represented by like numbers with different lower case letter suffix. The present invention provides a structure and charging means within the integrated circuit die that substantially transfers the capacitive charging requirements normally associated with an integrated circuit connection pad to an intermediate structure located between the connection pad and the integrated circuit substrate.

Referring now to FIG. 1, a schematic of a capacitor is illustrated in isometric view along with schematic connections to a charging voltage source. A capacitor C may be formed by at least two flat metal plates 102 and 104 placed close to each other but not touching. When switch 106 is closed, a voltage potential V from the voltage source (battery) 108 causes electrons to be attracted from the plate 102 to the positive terminal 116 of the battery 108. The same number of electrons are repelled onto the plate 104 from the battery 108 negative terminal 118. Ultimately, there is a voltage potential V between the plates 102 and 104 supplied from the battery 108.

The electron quantity difference between the plates 102 and 104 creates a charge or quantity of electricity that is held in an electric field between the capacitor plates 102 and 104, and is proportional to the applied voltage V and the capacitance value of the capacitor. The formula for the charge or quantity of electricity held in the capacitor C is:

$$Q = CV \qquad (1),$$

where Q= charge in coulombs, C= capacitance in farads, and V= potential in volts.

The energy required to charge the capacitor or that is ultimately stored in the capacitor is also a function of voltage potential and capacitance as follows:

$$W = V^2 C/2 \qquad (2),$$

where W=energy in joules (watt-seconds), V= voltage potential, and C= capacitance in farads. The amount of charge, and the amount of energy required to charge a given value of capacitance is dependant on the voltage or the square of the voltage, respectively. Thus, by reducing the voltage potential between the plates 102 and 104, the amount of charge and energy to fully charge the capacitor C is reduced.

Capacitance is a function of the geometrical area of the plates 102 and 104, the spacing 110 therebetween, and the dielectric constant of insulating material therebetween. The formula for determining the capacitance of a structure such as the capacitor C of FIG. 1 is as follows:

$$C = 0.224 \, KA/d \qquad (3),$$

where C is the capacitance in picofarads, K is the dielectric constant of the material between the plates 102 and 104, A is the area of one side of one plate in square inches represented by length 112 times width 114, and d is the separation 110 of the plate surfaces in inches. If one plate is of smaller area than the other plate, then use the area of the smaller plate.

Figure 2:
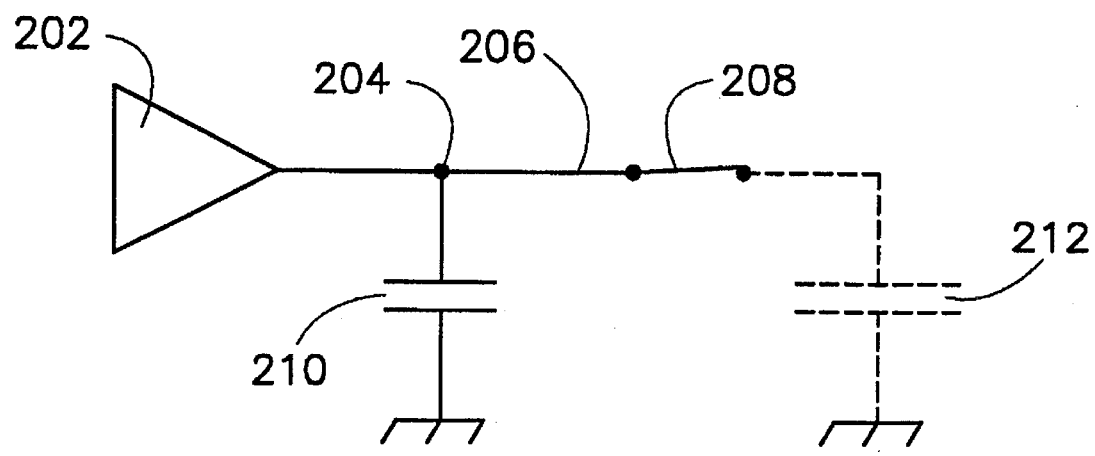
FIG. 2 is a schematic block diagram of an output driver and associated connection pad capacitance and connection capacitance.

Referring now to FIG. 2, a schematic block diagram of an output driver and associated connection pad and external capacitances is illustrated. The integrated circuit die comprises a plurality of transistors where some may be connected to the integrated circuit die as output amplifiers for driving external loads. One typical amplifier is a complementary metal oxide semiconductor (CMOS) amplifier 202 whose output is connected to an integrated circuit die connection pad 204 which connects by means of a bond wire 206 to a lead frame 208. The lead frame 208 connects to the external electronic system circuits.

The connection pad 204 typically is a square planar metal plate in parallel with the substrate of the integrated circuit die and forms a capacitor 210. The pad 204 may be, for example, 60 to 100 micrometers on a side and substantially square. The capacitance of the pad 204 may be, for example, 0.5 to 1 pF. The lead frame 208 connects to the external circuits which may have a capacitance 212 of about 5 pF.

Figure 3A:
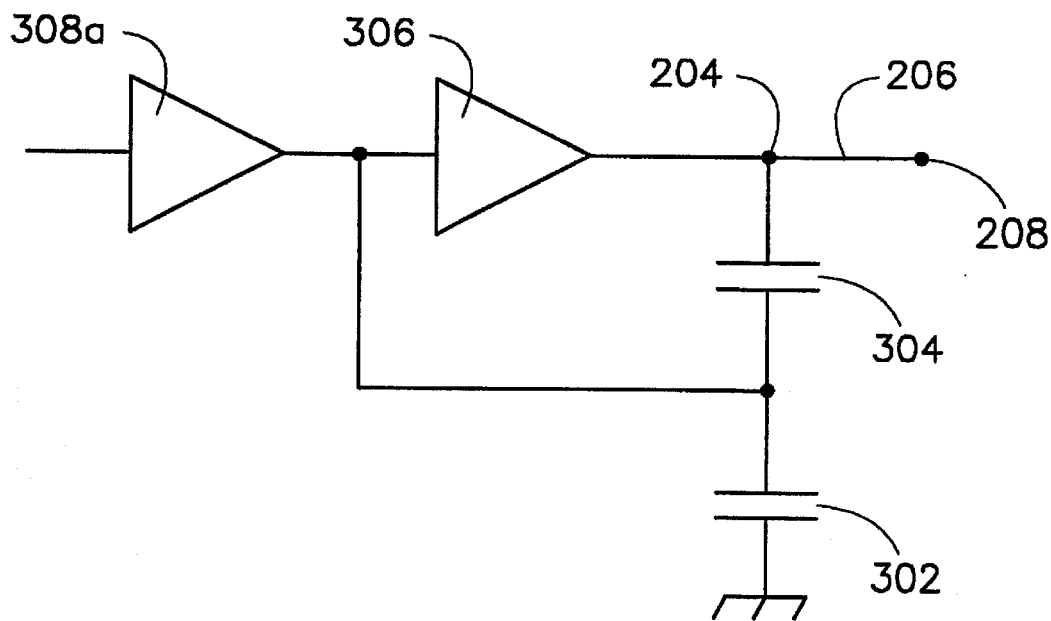
FIGS. 3a and 3b are electrical schematic block diagrams of preferred embodiments of the present invention.
Figure 3B:
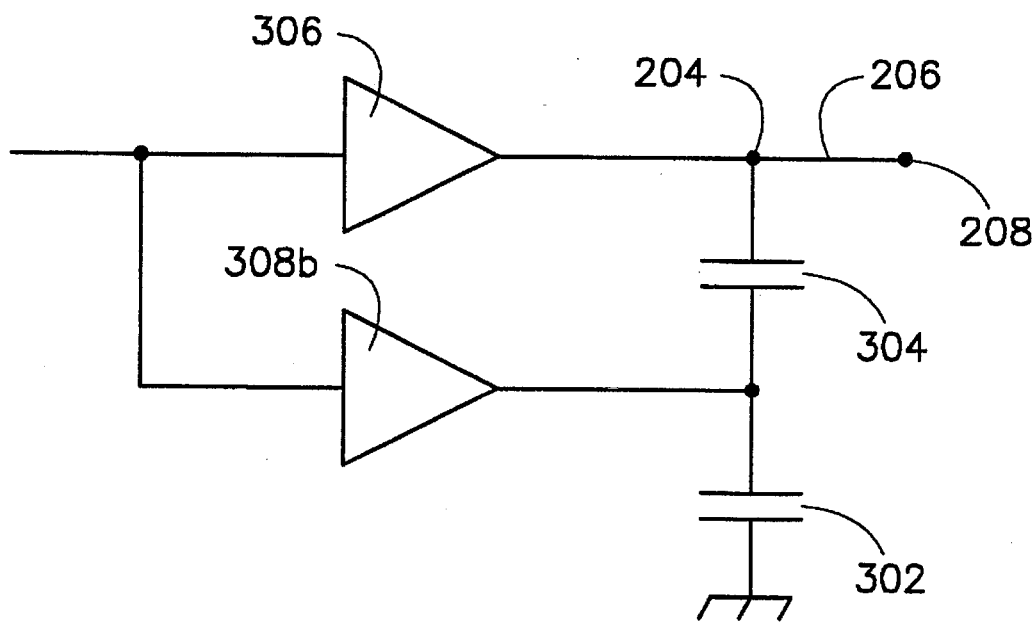
Figure 6:
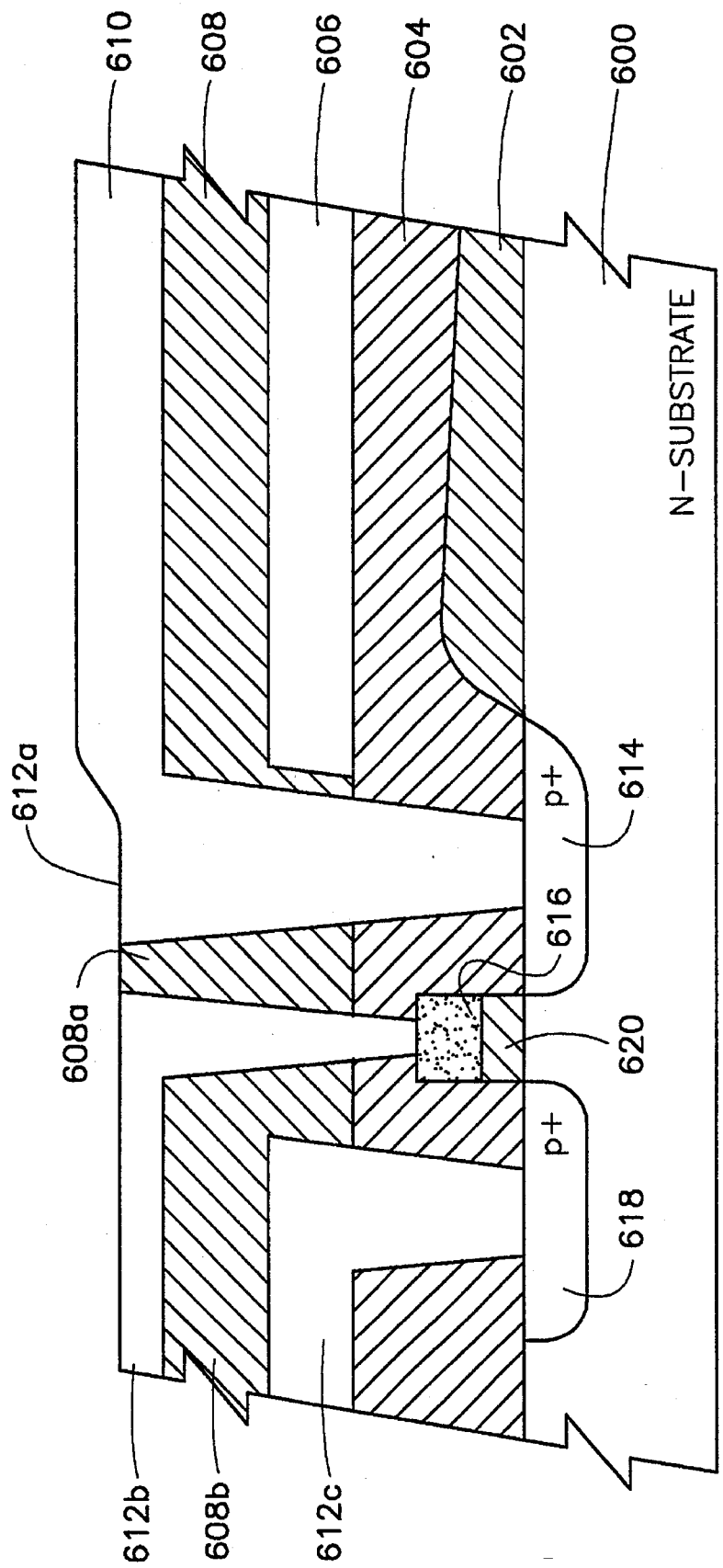
FIG. 6 is a schematic elevational view of a preferred embodiment of the present invention.

Referring now to FIGS. 3a, 3b, and 6, preferred embodiments of the present invention are illustrated in schematic block diagram and elevational views. An intermediate planar conductive structure 606 (FIG. 6) and the integrated circuit substrate 600 forms a capacitor 302 in series with capacitor 304 now formed by the connection pad 610 and the intermediate planar conductive structure 606.

Amplifier 306 drives the pad capacitance 304 and the external load capacitance (not illustrated). Amplifier 308a or 308b drives the capacitor 302. The output of amplifier 308a or 308b charges the capacitor 302 to substantially the same voltage potential as does amplifier 306 charge capacitor 304. Thus, the voltage potential on either plate of the capacitor 304 is substantially the same. Therefore, the amplifier 306 need not supply much, if any, energy to charge the capacitor 304.

The amplifier 308a or 308b now supplies the necessary energy to charge capacitor 302. Amplifier 308a may be connected before and drive amplifier 306, or amplifier 308b input, may be connected in parallel with the input of amplifier 306. An advantage of the amplifier 308a is that it may precharge the capacitor 302 which may allow smaller transistors to be utilized in the circuit of the amplifier 308a. On the other hand, amplifier 308b may track the signal output rise time of amplifier 306 more closely.

Utilizing either of the circuits of FIGS. 3a or 3b results in a reduction of drive required from the output amplifier 306. In the system and method of the present invention, reduced drive requirements of the amplifier 306 allow reduction in the amplifier transistor size. Smaller transistors enable more transistors on a given integrated circuit die size.

Figure 4:
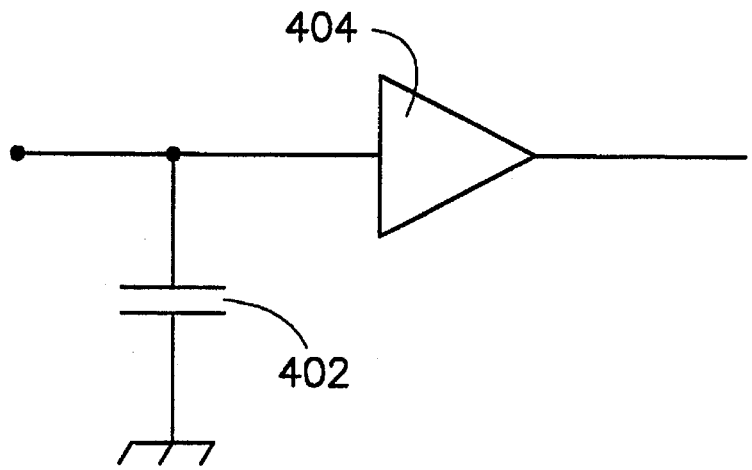
FIG. 4 is a schematic block diagram of an input circuit and associated connection pad capacitance.
Figure 5:
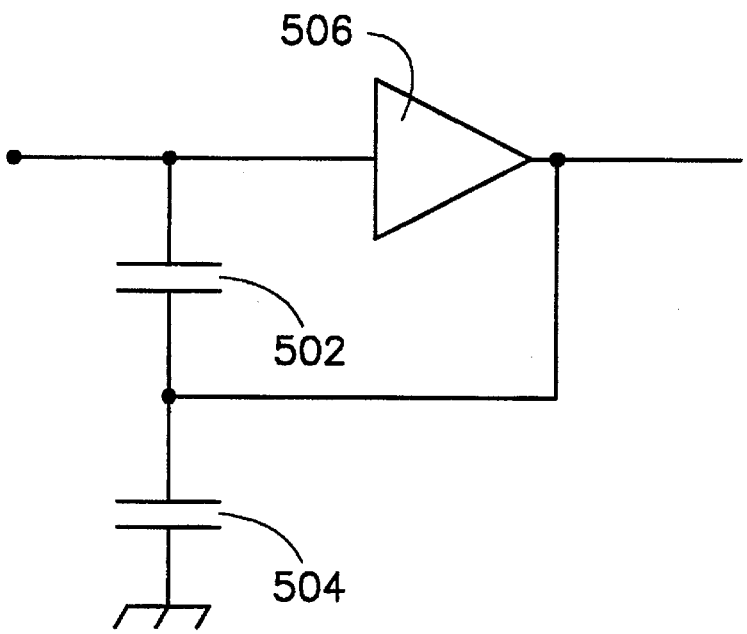
FIG. 5 is a schematic block diagram of a preferred embodiment of the present invention for an input circuit.

Referring now to FIGS. 4 and 5, schematic block diagrams illustrating input capacitance, and the present invention for reducing input capacitance charging, are illustrated, respectively. Input capacitance 402 results from an input pad consisting of a planar metal pad in parallel with the integrated circuit die substrate. This input capacitance 402 is similar to the output capacitance 210 (FIG. 2) described above.

An intermediate planar conductive structure 606 (FIG. 6) may be located between the input pad and the integrated circuit die substrate 600 in similar fashion to the output circuit embodiment described above. The difference, however, between the output embodiment and the input charge reduction embodiment illustrated in FIG. 5, is that a capacitor 504, formed from the intermediate planar conductive structure 606 and the integrated circuit die substrate 600, cannot be charged to a voltage value substantially the same as the voltage on capacitor 502 until the propagation delay time of amplifier 506.

Charging of the capacitor 504 by amplifier 506 may be delayed by about less than 100 picoseconds. Therefore, if the rise time of the input signal is longer than the propagation delay time of the amplifier 506, then the amplifier 506 will charge the capacitor 504 substantially at the same time as does the input charge capacitor 502. Thus, the amount of charge or energy necessary to charge the input capacitor 502 becomes negligible.

Fabrication of integrated circuits is well known to those skilled in the art, and exact details of a particular way of fabricating integrated circuits is not the intent of this disclosure. One skilled in the art of fabricating integrated circuits will readily appreciate the novelty and usefulness of the present invention disclosed herein.

Referring now to FIG. 6, a schematic elevational view of a preferred embodiment of the present invention is illustrated. An integrated circuit die comprises a substrate 600 over which a field oxide layer 602 is applied by chemical vapor deposition (CVD) or by other means well known in the art. Transistor elements such as a source and drain may be formed in doped wells in the substrate 600 such as, for example, p-wells 614 and 618, respectively. A gate element 616 may be formed over a thin oxide layer 620. This combination of transistor elements forms a PMOS transistor.

An NMOS transistor may be similarly formed with negative doped wells.

Over the field oxide layer 602 and transistor elements 614, 616 and 618, a thick oxide layer 604 may be deposited by CVD or other means well known in the art. The thick oxide layer 604 may be used to insulate the transistor elements from the next layer of, for example, metal connections. Above the thick oxide layer 604, an intermediate planar conductive structure 606 may be deposited thereon. The intermediate planar conductive structure 606 forms one plate of a capacitor (i.e., capacitor 302, FIG. 3a) and the substrate 600 forms the other plate. The intermediate planar conductive structure 606 may be metal or polysilicon, or any other conductive means utilized in the fabrication of the integrated circuit. Transistor element 614 and connection pad 610 may be connected together by conductor 612a. The gate element 616 may be connected to by conductor 612b, and transistor element 618 may be connected to by conductor 612c.

Another layer of insulating oxide 608 may be deposited over the intermediate planar conductive structure 606 and then the output connection pad 610 deposited over the insulating oxide layer 608. The capacitor 304 of FIG. 3a is formed by the combination of intermediate planar conductive structure 606 and connection pad 610. The voltage on the intermediate planar conductive structure 606, however, tracks the voltage on the output connection pad 610; therefore, the voltage potential difference therebetween is minimal. Minimal voltage difference requires minimal charging energy from an output driver. In this way the present invention reduces the amount of charging energy required from an output amplifier. In similar fashion, a corresponding input charging energy reduction may be obtained by utilizing the embodiment illustrated in FIG. 5.

The present invention, therefore, is well adapted to carry out the objects and attain the ends and advantages mentioned, as well as others inherent therein. While a presently preferred embodiment of the invention has been given for purposes of disclosure, numerous changes in the details of construction, interconnection and arrangement of parts will readily suggest themselves to those skilled in the art and which are encompassed within the spirit of the invention and the scope of the appended claims.

What is claimed is:

1. A method for reducing the capacitance of input and output connection pads on an integrated circuit, comprising the step of changing a voltage potential on an intermediate conductive structure located between a respective one of the integrated circuit input and output connection pads and the integrated circuit substrate such that the change in the voltage potential on the intermediate conductive structure substantially tracks the change in the voltage potential on the respective one of the integrated circuit input and output connection pads.

* * * * *